United States Patent
Pappu et al.

(10) Patent No.: US 10,705,142 B2
(45) Date of Patent: Jul. 7, 2020

(54) DEVICE, SYSTEM AND METHOD FOR PROVIDING ON-CHIP TEST/DEBUG FUNCTIONALITY

(71) Applicant: Intel Corporation, Santa Clara, CA (US)

(72) Inventors: Lakshminarayana Pappu, Folsom, CA (US); Suketu U. Bhatt, Folsom, CA (US); Satheesh Chellappan, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 676 days.

(21) Appl. No.: 15/394,666

(22) Filed: Dec. 29, 2016

(65) Prior Publication Data

US 2018/0188321 A1    Jul. 5, 2018

(51) Int. Cl.
  *G01R 31/00*  (2006.01)
  *G01R 31/317*  (2006.01)
  *G06F 11/00*  (2006.01)

(52) U.S. Cl.
  CPC .  *G01R 31/31724* (2013.01); *G01R 31/31705* (2013.01); *G06F 11/00* (2013.01)

(58) Field of Classification Search
  CPC ........ G01R 31/31724; G01R 31/31705; G06F 11/00; G06F 11/273; G06F 11/3648
  See application file for complete search history.

(56) References Cited

U.S. PATENT DOCUMENTS

| | | | |
|---|---|---|---|
| 7,100,092 B2* | 8/2006 | Allred | H04L 43/18 370/241 |
| 7,657,807 B1* | 2/2010 | Watkins | G01R 31/318594 714/718 |
| 9,575,552 B2* | 2/2017 | Por | G06F 1/266 |
| 9,979,432 B2* | 5/2018 | Khan | H04B 1/40 |

(Continued)

FOREIGN PATENT DOCUMENTS

WO    WO-2016153609    9/2016

OTHER PUBLICATIONS

L. Wang, P. Hegde, V. Nawathe, R. Staszewski, P. Balsara and V. Oklobdzija, "Design of a link-controller architecture for multiple serial link protocols," 23rd IEEE International SOC Conference, Las Vegas, NV, 2010, pp. 266-271. (Year: 2010).*

(Continued)

*Primary Examiner* — Cynthia Britt
(74) *Attorney, Agent, or Firm* — Womble Bond Dickinson (US) LLP

(57) ABSTRACT

Techniques and mechanisms for providing on-chip link control functionality to facilitate emulation of a communication. In an embodiment, an integrated circuit (IC) chip includes a physical layer (PHY) which supports communication compatible with a high-speed serial interface standard. A link controller of the IC chip is coupled between the PHY and an interconnect architecture which variously couples a host and other resources of the IC chip to each other. A test controller of the IC chip signals a test mode to implement a loopback path of the link controller in lieu of one or more functional paths for communication with the PHY. In another embodiment, signal output by the loopback path emulate a communication from a resource other than the test controller.

20 Claims, 11 Drawing Sheets

(56) References Cited

U.S. PATENT DOCUMENTS

| | | | | |
|---|---|---|---|---|
| 2005/0097403 A1* | 5/2005 | Chen | ............ | G06F 11/221 |
| | | | | 714/43 |
| 2012/0110217 A1* | 5/2012 | Christiansen | ......... | G06F 11/349 |
| | | | | 710/15 |
| 2015/0067208 A1* | 3/2015 | Iyer | ............ | G06F 13/42 |
| | | | | 710/105 |
| 2015/0363349 A1* | 12/2015 | Remple | ............ | G06F 13/426 |
| | | | | 710/313 |
| 2016/0124822 A1* | 5/2016 | Remple | ............ | G06F 11/221 |
| | | | | 714/30 |
| 2016/0182257 A1* | 6/2016 | Froelich | ............ | H04L 25/0262 |
| | | | | 375/229 |
| 2016/0283423 A1* | 9/2016 | Srivastava | ............ | G06F 13/362 |
| 2017/0091060 A1* | 3/2017 | Vadivelu | ............ | G06F 11/221 |
| 2018/0095923 A1* | 4/2018 | Iyer | ............ | G06F 13/4068 |

OTHER PUBLICATIONS

Yu Yun, Wang Danghui, Yang Ke and Feng Zhihua, "Design of link layer controller for high speed serial bus," The 2nd International Conference on Information Science and Engineering, Hangzhou, 2010, pp. 1997-2000. (Year: 2010).*

A. Wu, X. Jin, S. Guo and X. Du, "A flexible FPGA-to-FPGA interconnect interface design and implementation," 2015 International Conference on Computers, Communications, and Systems (ICCCS), Kanyakumari, 2015, pp. 52-56 (Year: 2015).*

J. Saadé, F. Pétrot, A. Picco, J. Huloux and A. Goulahsen, "A system-level overview and comparison of three High-Speed Serial Links: USB 3.0, PCI Express 2.0 and LLI 1.0," 2013 IEEE 16th International Symposium on Design and Diagnostics of Electronic Circuits & Systems (DDECS), 2013, pp. 147-152. (Year: 2013).*

\* cited by examiner

| PowerDn | TxDetectRx/Loopback | Tx ElecIdle | Host detect Req | Host lfps req | Rx status | Rx ElecIdle | Rxvalid | State |
|---|---|---|---|---|---|---|---|---|
| P0: 00 | 0 | 0 | 0 | 0 | 3'd0 | 0 | 1 | 410 |
| | 0 | 1 | 0 | 0 | 3'd0 | 0 | 0 | 415 |
| | 1 | 0 | 0 | 0 | 3'd0 | 0 | 1 | 420 |
| | 1 | 1 | 0 | 1 | 3'd0 | 1 | 0 | 425 |
| P0s: 01 | X | 0 | 0 | 1 | 3'd0 | 1 | 0 | 430 |
| | X | 1 | 0 | 1 | 3'd0 | 0 | 0 | 435 |
| P1: 10 | 0 | 0 | 0 | 0 | 3'd0 | 0 | 1 | 440 |
| | 1 | 1 | 1 | 1 | 3'd0 | 0 | 1 | 445 |
| | 1 | 1 | 0 | 0 | 3'd3 | 0 | 1 | 450 |
| P2: 11 | X | 1 | 1 | 1 | 3'd0 | 1 | 1 | 455 |
| | X | 1 | 1 | 0 | 3'd3 | 0 | 1 | 460 |

FIG. 4

DEVICE, SYSTEM AND METHOD FOR PROVIDING ON-CHIP TEST/DEBUG FUNCTIONALITY

BACKGROUND

1. Technical Field

Embodiments of the present invention generally relate to the testing of a system and more particularly, but not exclusively, to circuit structures to provide on-chip test functionality.

2. Background Art

Advances in semi-conductor processing and logic design have enabled an increase in the amount of logic that may be present on an integrated circuit (IC) device. As a result, successive generations of IC devices continue to shrink in size while supporting more storage, processing capability, communication bandwidth, etc. Some generally-available IC devices support interface standards—such as recent Universal Serial Bus (USB) standards—which provide for data rates of 5 Gigabits per second (Gbps) and even up to or exceeding 10 Gbps.

As such high-speed IC devices continue to grow the number, variety and capability, manufacturers are starting to detect problems in the reliability of high-speed links. Such problems pose significant impediments to implementing next-generation improvements to device integration. Decreased link reliability also affects related technical areas, such as the need to securely provide firmware updates. The increasing integration, speed, and functionality of such IC devices poses challenges for manufacturers who need to debug, validate and launch products in a timely or cost-effective manner. Accordingly, there is expected to be an increasing premium placed on incremental improvements for providing solutions to test and/or debug integrated circuitry.

BRIEF DESCRIPTION OF THE DRAWINGS

The various embodiments of the present invention are illustrated by way of example, and not by way of limitation, in the figures of the accompanying drawings and in which:

FIG. 4 is a table illustrating data to control communication of test or debug information according to an embodiment.

DETAILED DESCRIPTION

Embodiments discussed herein variously provide techniques and mechanisms for providing on-chip link control functionality to facilitate emulation of various communication characteristics. In an embodiment, an integrated circuit (IC) chip includes a physical layer ('PHY' or 'PHY layer' herein) which supports communication compatible with a high-speed serial interface standard. Link control circuitry (or a "link controller") of the IC chip may be coupled between the PHY and an interconnect architecture which variously couples a host and other resources of the IC chip to each other.

During functional mode operation of the IC chip, the link control circuitry may relay or otherwise enable communication between the PHY and the interconnect architecture. By contrast, and alternative mode may include the link control circuitry configuring a loopback mode which is to output back to the interconnect architecture data which the link control circuitry previously received from the interconnect architecture. Communication along a loopback path may be independent of the PHY layer—e.g., wherein the link control circuitry decouples or otherwise disables one or more functional paths of communication to/from the PHY. Signals generated during a loopback mode may facilitate emulation of a device—e.g., wherein such signals are interpreted by a recipient thereof as being sent from a resource other than the link control circuitry and/or are interpreted as targeting a resource other than one identified a corresponding message which was previously sent to the link control circuitry.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies may be employed in any of a variety of electronic devices including an IC chip having link control functionality described herein.

Figure 1:
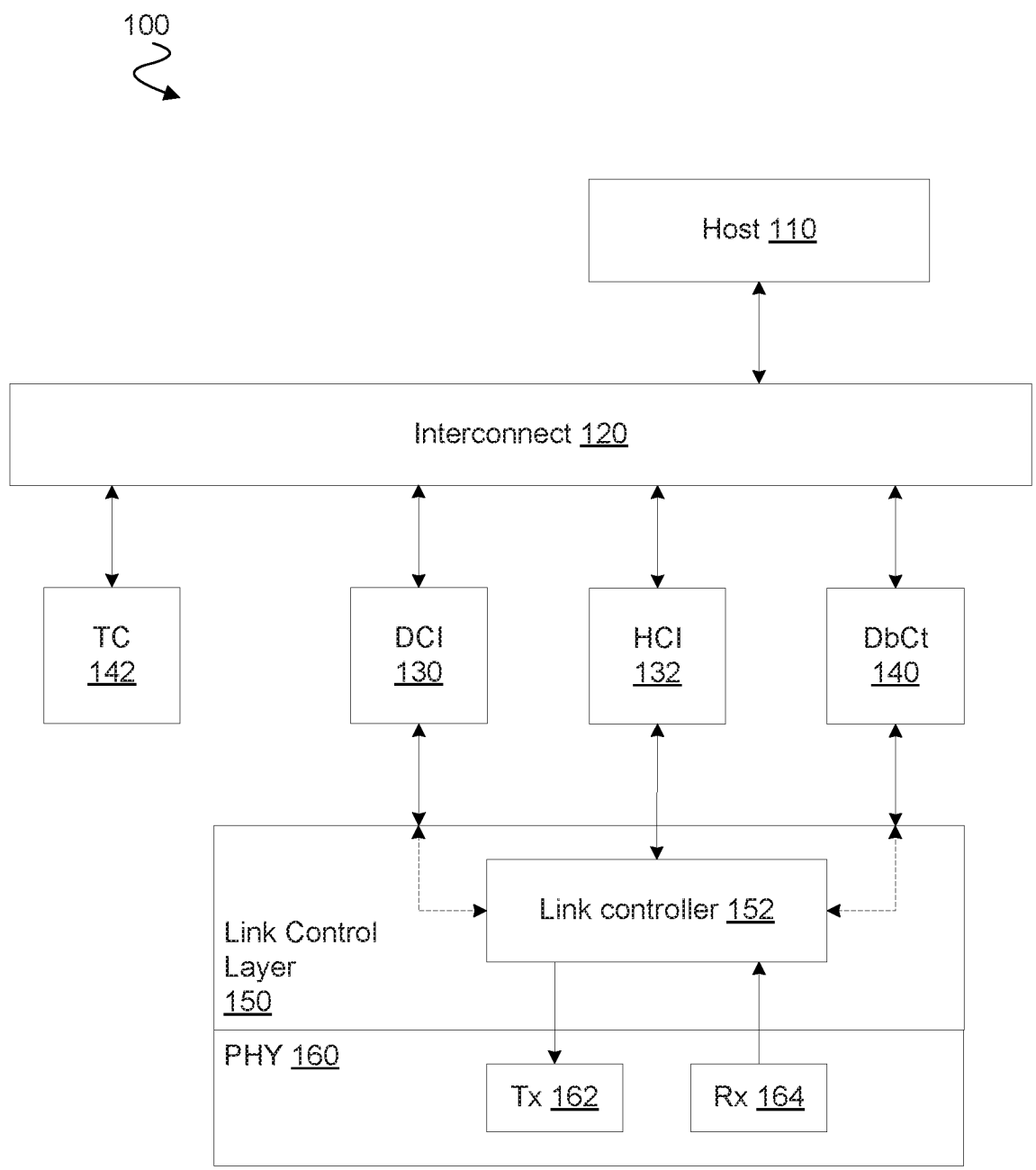
FIG. 1 is a functional block diagram illustrating elements of a system to test or debug integrated circuitry according to an embodiment.

FIG. 1 illustrates elements of the integrated circuit (IC) chip 100 to provide test and/or debug functionality according to an embodiment. IC chip 100 is one example of an embodiment wherein link control logic is configured to selectively disable communication with a physical (PHY) layer and to emulate signals as being received, for example, from a resource other than a test controller of the IC chip (e.g., a host, a device of the IC chip or a remote agent coupled via the PHY layer).

IC chip 100 may provide functionality of a system-on-chip (SoC) wherein a host 110 of IC chip 100—e.g., the host 110 including one or more processor cores—is coupled to direct of otherwise control operation of other functional components of IC chip 100. Host 110 may include a processor to execute an operating system, for example. Functional components to be controlled by host 110 may comprise one or more of a memory, input/output hub, memory controller, bus and/or any of a variety of other resources of IC chip 100. In the particular context of a host of an IC chip which controls another resource of that same IC chip, "device" is used herein to refer to the other resource which is so controlled.

Host 110 may be coupled to a device (or devices) of IC chip 100 via one or more buses and/or other interconnect structures, which are represented in FIG. 1 by the illustrative interconnect 120 shown. Such interconnect structures may support media access control (MAC) communication mechanisms, peripheral control interface (PCI) communication mechanisms and/or the like. However, the particular number and arrangement of such buses or other interconnect structures may vary according to implementation-specific details, and are not limiting on some embodiments.

In the illustrative embodiment shown, IC chip 100 includes a physical layer PHY 160 to provide access between some or all resources of IC chip 100—e.g., including host 110—and other resources (not shown) that are to be coupled via PHY 160. Such other resources may be distinct from IC chip 100, although some embodiments are not limited in this regard. PHY 160 may include circuitry (e.g., including the illustrative transmit block Tx 162 and receive block Rx 164 shown) to variously transmit or receive analog signals. For example, Tx 162 and receive block Rx 164 may each include a respective analog front end (AFE) with which IC chip 100 is to variously receive or output analog communications. Operation of PHY 160 may be compatible with a high-speed serial interface standard, where "high-speed"—in this context—refers to support for a data rate of 1.5 Megabits per second (MBps) or more and, in some embodiments, four Gigabits per second (4 Gbps) or more. In some embodiments, the high-speed serial interface standard supports a data rate which is equal to or more than 5 GBps (e.g., wherein a data rate of 10 GBps is supported). For example, the high-speed serial interface standard may be one that is defined in a Universal Serial Bus (USB) interface developed by the USB Implementers Forum (USB IF). By way of illustration and not limitation, such a serial interface standard may be one defined in the USB 3.0 specification published by the USB IF on Nov. 12, 2008 or in the USB 3.1 specification released by the USB IF on Jul. 31, 2013.

Certain features of various embodiments are described herein with reference to a PHY that supports communication according to a USB standard. However, such description may be extended to additionally or alternatively apply to a PHY that supports communication according to any of a variety of other high-speed serial interface standards—e.g., including a Serial AT Attachment (SATA) standard such as that defined by any of a variety of specifications released by the Serial ATA International Organization (SATA-IO). Examples of such specifications include, but are not limited to, the SATA revision 3.2 specification released August, 2013 by the SATA-IO, the SATA revision 3.0 specification released May, 2009 by the SATA-IO and the SATA revision 1.0 specification released January, 2003 by the SATA-IO, etc. In some embodiments, link control mechanisms are to operate with a PHY that supports communication according to any of a variety of Peripheral Component Interconnect Express (PCIe) standards released by the PCI Special Interest Group (PCI-SIG). Examples of such PCIe standards include the PCIe base 3.1 specification released November 2014 by the PCI-SIG, the PCIe base 3.0 specification released November 2010 by the PCI-SIG, the PCIe base 2.0 specification released January 2007 by the PCI-SIG, etc. In an embodiment, communication by the PHY is selectively enabled or disabled by link control circuitry that, for example, accommodates control mechanisms which are compatible with a PHY Interface for PCI Express (PIPE) standard.

To facilitate access to host 110, a host control interface (HCI) 132 of IC chip 100 may be coupled between PHY 160 and interconnect 120. HCI 132 may include one or more addressable ports (e.g., including a transmit port and a receive port) which, for example, are allocated to be used by host 110 for communicating information via interconnect 120. A device control interface (DCI) 130 may also be coupled between PHY 160 and interconnect 120—e.g., where DCI 130 includes one or more ports which are similarly allocated for use by one or more other devices of IC chip 100. In an embodiment, HCI 132 (or DCI 130) may comprise control logic to facilitate communication via interconnect 120 with host 110 (or with a corresponding other device of IC chip 110).

Emulation functionality of IC chip 100 may be provided at a link control layer 150 which is coupled between interconnect 120 and PHY 160. Such emulation functionality may, for example, enable representation of signals as being received from a source other than link control layer 150 (e.g., other than a resource of IC chip 100). Alternatively or in addition, emulation may include or result in a redirecting and/or other modification of a command, request or other message—e.g., where communication of the message is modified to target an alternative resource of IC chip 100.

Emulation functionality of link control layer 150 may be provided with one or more controllers (e.g., including the illustrative link controller LC 152 shown) each coupled between PHY 160 and respective interfaces with interconnect 120. LC 152 may be coupled, for example, to interconnect 120 via HCI 132 and further coupled to Tx 162 and Rx 164. In such an embodiment, LC 152 may be further coupled to interconnect 120 via one or more other communication paths. For example, interconnect 120 may be further coupled to 52 via DCI 130—e.g., in parallel with the connection to interconnect 120 via HCI 132. In some embodiments, IC chip 100 includes a debug controller DbCt 140 coupled between interconnect 120 and link control layer 150. DbCt 140 may include circuitry coupled to communicate with other resources of IC chip 100, wherein DbCt 140 accumulates debug information based on such communications. In such an embodiment, LC 152 may be coupled to interconnect 120 via an interface with DbCt 140—e.g., instead of LC 152 being coupled to interconnect 120 via DCI 130.

Link controller 152 may provide functionality to snoop, intercept or otherwise detect signals received from interconnect 120. Based on such detection, LC 152 may determine whether to relay or otherwise allow communication of such signals to PHY 160 (e.g., to Tx 162) or whether to instead perform an emulation in lieu of such communication with PHY 160. By way of illustration and not limitation, IC chip 100 may further comprise the test controller TC 142 operable to configure a test mode that, for example, is to be distinguished from another mode (referred to herein as a "functional node") which supports general purpose operation including communications via PHY 160. For example, LC 152 may receive from TC 142 one or more control signals indicating that the test mode is to be configured. The one or more control signals may be communicated via a sideband channel (not shown) or, for example, via interconnect 120.

Configuration of the test mode may include LC 152 disabling one or more paths of communication with PHY 160. For example, LC 152 may include or couple to any of a variety of switches, power gate circuits, clock gate circuits and/or other such mechanisms to selectively enable or disable communication between one of DCI 130, HCI 132, DbCt 140 and one or both of Tx 162, Rx 164. In some embodiments, configuration of a test mode includes enabling communication along an alternative path (for brevity, referred to herein as a "loopback path") between two interfaces which are each coupled between LC 152 and interconnect 120. For example, a loopback path may enable communication via LC 152 between DCI 130 and HCI 132. In an embodiment wherein IC chip 100 includes DbCt 140, an additional or alternative loopback path may be configured to facilitate communication between HCI 132 and DbCt 140 via LC 152 (or some other link controller of link control layer 150). A loopback path may be entirely in a digital domain—e.g., wherein any signals communicated along such a loopback path comprise digital information and (for example) are not converted to or from corresponding analog signals during communication along the loopback path.

In some embodiments, a loopback path includes or couples to circuitry which enables the accumulation of information (referred to herein as "signature information") which is indicative of the integrity of a given resource of the IC chip—e.g., where the resource is involved in an earlier communication on which the signature information is based. By way of illustration and not a limitation, communications sent from (or to be sent to) TC 142 along a loopback path may emulate host 110 to DCI 130 (and in some embodiments, to a device of IC chip 100 that is controlled by host 110 via DCI 130). Alternatively or in addition, a communication sent from (or to be sent to) TC 142 along a loopback path may enable emulation of a device other than TC 142 to HCI 132 (and in some embodiments, to host 110). Such loopback communications may result in the generation of signature information indicating a test result for evaluating one or more components of IC chip 100.

In some embodiments, emulation processes with LC 152 additionally or alternatively include operations to convert memory mapping information and/or a memory access requests based on such memory mapping information. For example, LC 152 may convert a request to access one memory resource into a request which instead accesses an alternative resource. Such request conversion may be transparent to a requesting agent (e.g., where the requesting agent is host 110 or another device of IC chip 100 or, alternatively, an external agent which is coupled to link control layer 150 via PHY 160). Accordingly, link control layer 150 may provide to some device which is coupled to IC chip 100 (and/or to a resource of IC chip 100) an emulated memory mapping other than an actual mapping for memory resources of IC chip 100. Correspondingly, link control layer 150 may provide to host 110 (or some other resource of IC chip 100) an emulation of a device as requesting one memory resource, where the device in fact issued a request which targeted a different (or even a non-existent) resource. Certain features of various embodiments are described herein with reference to a link controller which operates to perform emulation in support of test and/or debug processes. However, such description may be extended to apply to a link controller which additionally or alternatively emulates memory mapping and/or memory requests.

Figure 2:
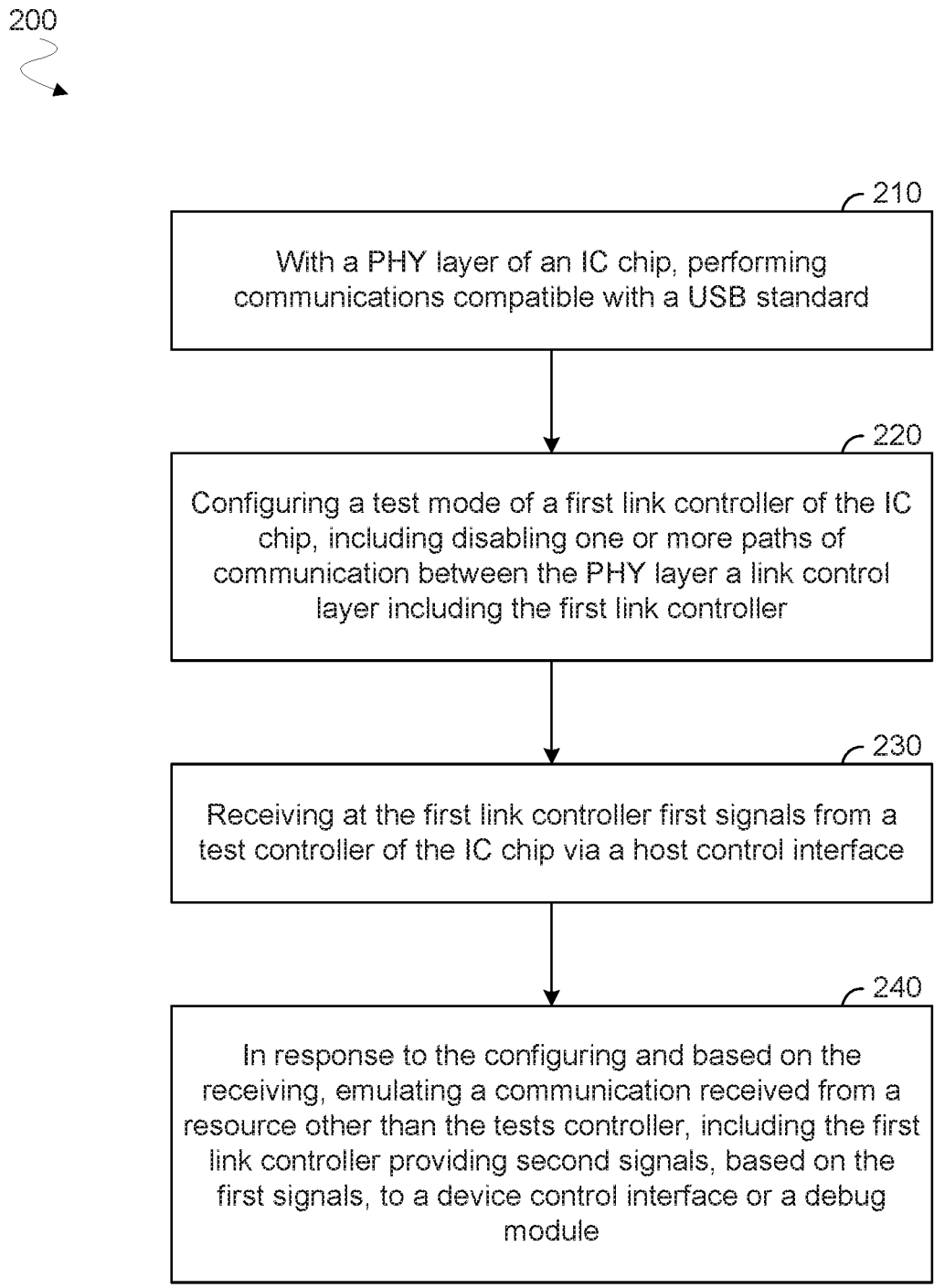
FIG. 2 is a flow diagram illustrating elements of a method for testing or debugging integrated circuitry according to an embodiment.

FIG. 2 illustrates elements a method 200 to operate an IC chip according to an embodiment. Method 200 is one example of a method that may provide on-chip test/debug functionality—e.g., wherein circuitry to perform method 200 has some or all of the features of IC chip 100.

Method 200 may comprise, at 210, performing, with a PHY layer of an IC chip, communications which are compatible with a USB standard. Such communications may take place during a functional mode of the IC chip. In an embodiment, the USB standard supports a data rate of 5 GBps—e.g., wherein the USB standard is set forth in the USB 3.0 specification or the USB 3.1 specification.

Method 200 may further comprise, at 220, configuring a test mode of a first link controller of the IC chip. For example, the PHY layer may have a configuration such as that of PHY 160—e.g., wherein a link control layer of the IC chip is coupled between the PHY layer and an interconnect of the IC chip. Such a link control layer may include the first link controller, which (for example) may be coupled to the interconnect via a host control interface (e.g., HCI 132), and further coupled to the interconnect via one of a device control interface (e.g., DCI 130) and a debug controller (e.g., DbCt 140).

The configuring at 220 may include disabling one or more paths of communication between the PHY layer and a link control layer including the first link controller. For example, the first link controller may include or couple to one or more switches, power gating circuitry and/or clock gating circuitry to communicatively decouple PHY transmit logic and/or PHY receiver logic. Alternatively or in addition, configuring the test mode at 220 may include coupling one or more loopback paths. In this context, "loopback" refers to characteristic of a link controller sending second signals back to an interconnect architecture from which first signals were received—e.g., in lieu of the link controller sending the first signals through to a PHY layer. By way of illustration and not limitation, method 200 may further comprise, at 230, receiving at the first link controller first signals from a test controller of the IC chip via a host control interface. In other embodiments, the first signals received at 230 are instead provided by a host of an IC chip or a resource (device) of the IC chip other than a test controller.

In response to the configuring at 220 and based on the receiving at 230, method 200 may emulate, at 240, a communication received from a resource other than the test controller (e.g., from a host, a device or a receive block of the PHY layer). The emulating at 240 may include the first link controller providing second signals, based on the first signals, to a device control interface or to a debug controller which is coupled between the first link controller and the interconnect. For example, the first link controller may convert data of the first signals into data of the second signals. The first link controller may further generate control signals—e.g., as part of, or to be association, with the second signals—to facilitate an emulation of the second signals as being sent from a host or a device of the IC chip other than the test controller.

In some embodiments, method 200 additionally or alternatively includes other operations to emulate a memory request which is a modified version of one previously received by the first link controller. For example, such other operations may include the first link controller receiving a memory access request from the interconnect—e.g., via one of the host control interface and the device control interface. The memory access request may target a first memory resource of the IC chip—e.g., the first memory resource identified by a first address (or range of addresses) of a memory. In such an embodiment, the first link controller may include or otherwise have access to reference information that provides one or more types of address mapping (e.g., virtual-to-physical address mapping and/or virtual-to-virtual address mapping). Based on such reference information, the first link controller to convert the memory access request to emulate a request which targets a memory resource other than the first memory resource.

Figure 3:
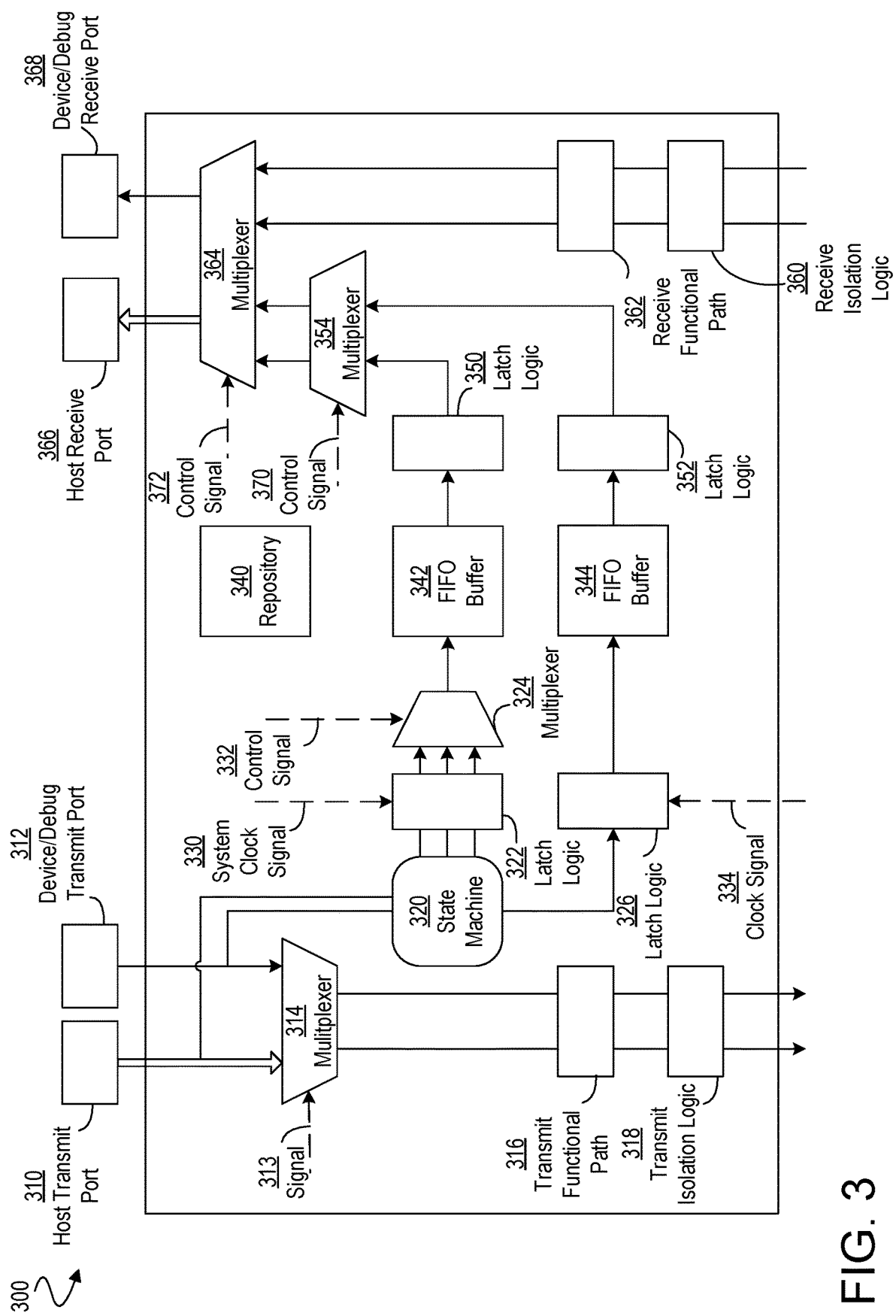
FIG. 3 is a functional block diagram illustrating elements of a link controller to communicate test or debug information according to an embodiment.

FIG. 3 illustrates elements a link controller 300 to determine communication with a PHY layer according to an embodiment. Link controller 300 may comprise some or all of the features of link controller 152, for example. In an embodiment, operations of method 200 are performed with circuitry of link controller 300.

Link controller 300 may support coupling to operate between a PHY layer (e.g., PHY 160) of an IC chip and one or more interfaces with an interconnect architecture of the IC chip—e.g., wherein the interconnect architecture includes one or more buses coupled to host circuitry and any of a variety of other circuit resources of the IC chip. During a functional mode of the IC chip, the host may variously control such other circuit resources—e.g., where such control is to facilitate communication by the IC chip via the PHY layer thereof. During another mode of the IC chip (e.g., a test mode), link controller 300 may redirect and/or otherwise modify the communication of signals—e.g., to emulate an agent and/or to emulate a request to access a resource.

In an embodiment, link controller 300 includes circuitry to couple to a host transmit port 310 and a host receive port 366 each of a host control interface (such as HCI 132). Link controller 300 may also include circuitry to couple to a device/debug transmit port 312 and a device/debug receive port 368 which, for example, are each of a device control interface (such as DCI 130) or each of an interface of a debug controller (such as DbCt 140). Host transmit port 310 may provide to link controller 300 signals from a host of the IC chip—e.g., host 110—or from another agent, such as a test controller, which emulates the host. Device/debug transmit port 312 may provide to link controller 300 signals from a device of the IC chip (other than the host) or from another agent, such as a test controller, which emulates such a device.

During functional mode operation of link controller 300, signals received from one of host transmit port 310 and device transmit port 312 are to be communicated to transit circuitry of a PHY layer. Alternatively or in addition, either of host receive port 366 and device/debug receive port 368 may, during functional mode operation, receive from link controller 300 respective signals provided via receiver circuitry of the PHY layer. For example, a transmit functional path 316 and a receive functional path 362 of link controller 300 may facilitate various communications with, respectively, a PHY transmit block and a PHY receive block (e.g., Tx 162 and Rx 164). A multiplexer 314 may be coupled to selectively enable communication from either of host transmit port 310 and device/debug transmit port 312, via transmit functional path 316, to the PHY transmit circuitry. Similarly, a multiplexer 364 may be coupled to selectively enable communication from the PHY receiver circuitry, via receive functional path 362, to either of host receive port 366 and device/debug receive port 368.

By contrast, a test mode of link controller 300 may include selectively disabling some or all communication via one or each of transmit functional path 316 and receive functional path 362. For example, link controller 300 may include or couple to transmit isolation logic 318 comprising switches and/or other circuitry operable to selectively isolate transmit functional path 316 from the PHY. Alternatively or in addition, link controller 300 may similarly include receive isolation logic 360 operable to selectively isolate receive functional path 362 from the PHY. A functional mode of link controller 300 may configure transmit isolation logic 318 and receive isolation logic 360 to enable respective communications via transmit functional path 316 and receive functional path 362. An alternative mode (for example, a test mode) may instead disable communication with one or both of 316 and receive functional path 362, and/or may selectively enable communication via at least one loopback path. In the illustrative embodiment shown, link controller 300 provides a first loopback path to communicate information between host transmit port 310 and device/debug receive port 368 and a second loopback path to communicate information between device/debug transmit port 312 and host receive port 366. However, link controller 300 may have more, fewer and/or differently configured loopback paths, in different embodiments.

Communication via a loopback path may be based at least in part on circuitry of link controller 300 (such as the illustrative state machine 320 shown) snooping or otherwise detecting first signals received via one of host transmit port 310 and device transmit port 312. State machine 320 (or other such circuitry) may determine that the received first signals are associated with an instance of a test mode and, based on such detecting, may provide to a loopback path second signals which are based on such first signals. For example, operation of state machine 320 may result in data of the first signals being reformatted or otherwise converted into data of the second signals. Alternatively or in addition, state machine 320 may generate one or more control signals to subsequently emulate a reception of the second signals via receive functional path 362 (and from the PHY receiver coupled thereto).

In the illustrative embodiment shown, the first loopback path comprises an in-series arrangement including latch logic 322, multiplexer 324, host control first-in-first-out (FIFO) buffer 342 and latch logic 350. The first loopback path may be coupled to receive information from a state machine 320 which is based on signals provided by host transmit port 310. Latch logic 322, 350 and host control FIFO buffer 342 may coordinate the timing of communication along the first loopback path—e.g., where a system clock signal 330 is coupled to operate one or both of latch logic 322, 350. Multiplexer 324, coupled between latch logic 322 and host control FIFO buffer 342, may determine an amount and/or order of information that is to be communicated from state machine 320 through the first loopback path. For example, multiplexer 324 may receive via latch logic 322 sets of signals each corresponding to a different respective device of the IC chip. In such an embodiment, multiplexer 324 may selectively pass information related to only one such device, as determined at least in part by a control signal 332 indicating a particular device that is to receive such information via device/debug receive port 368. Control signal 332 may, for example, be the same as, or otherwise based on, a signal 313 to control multiplexing by multiplexer 314.

Alternatively or in addition, a second loopback path provided by link controller 300 may comprise an in-series arrangement including latch logic 326, device control FIFO buffer 344 and latch logic 352. The second loopback path may be coupled to receive information from state machine 320 which is based on signals provided by device/debug transmit port 312. Latch logic 326, 352 and device control FIFO buffer 344 may coordinate the timing of communication along the second loopback path—e.g., where clock signal 334 is coupled to operate one or both of latch logic 326, 352.

In one embodiment, another multiplexer 354 is coupled between multiplexer 364 and each of the first loopback path and the second loopback path. Multiplexer 354 may provide the second signals to multiplexer 364—e.g., in response to a control signal 370 indicating which of the first loopback path and the second loopback path is to output the second signals. Control signal 370 may be provided by state machine 320 or, for example, from a test controller such as TC 142. Another control signal 372 (e.g., generated by state machine 320 or an external test controller) may selectively operate multiplexer 364 to provide an output from link controller 300. For example, in addition to multiplexing on the output side between host receive port 366 and device/debug receive port 368, multiplexer 364 may multiplex on the input side between loopback path signal lines and signal lines coupled to receive functional path 362.

In some embodiments, communication via a loopback path 300 is based on or otherwise determine reference information that, for example, may be used in test and/or debug evaluation processes. For example, link controller 300 may include or couple to a repository 340 (e.g., including a non-volatile memory) to store reference information to be evaluated or which is to be a basis for evaluation. For example, link controller 300 may write to repository 340 signature information which includes (or otherwise represents a state of) data, metadata and/or control information in the loopback path. Alternatively or in addition, repository 340 may store fiducial data with which link controller 300 (or a test controller coupled thereto) might evaluate such signature information. Signature information may be compared or otherwise evaluated based on fiducial data to determine whether one or more circuit components of the IC chip have failed to satisfy one or more performance metrics. In some embodiment, repository 340 may additionally or alternatively store memory mapping information to facilitate the conversion of a memory request—e.g., by state machine 320.

Referring now to FIG. 4, table 400 shows a logical description of control signal processing performed by a link controller according to an embodiment. Table 400 may represent operation of one of link controllers 152, 300, for example. In an embodiment, one or more operations of method 200 are based on signals shown in table 400.

Rows of table 400 each correspond to a respective operational state of a link controller and further correspond to a combination of signals which determine, or are based on, the respective operational state. In the illustrative embodiment shown, signals to be processed by a link controller are compatible with a PHY Interface for PCI Express (PIPE) standard. However, control signals compatible with any of a variety of other bus interface standards may be similarly processed in different embodiments.

As illustrated by table 400, a link controller may snoop three standard PIPE control signals—i.e., Powerdn, TxElecIdle and TxdetectRx/Loopback. The control signal Powerdn (or PowerDown) defines or otherwise indicates a power state for PHY transceiver circuitry—e.g., including one of a relatively high power state P0 (for a fully functional operational mode) and successively lower power states P0s, P1, P2. The signal TxElecIdle is to force a transmit output into an electric idle state. TxdetectRx/Loopback is a signal to indicate that a PHY is to begin a receiver detection operation, to begin a loopback or to signal Low Frequency Periodic Signaling Support (LFPS) during P0. It is noted that although loopback techniques are defined or otherwise referenced in conventional PCIe standards and USB standards, such techniques variously rely on loopback signaling which is internal to PHY. By contrast, some embodiments variously perform loopback in a digital domain of a link controller—e.g., while the digital domain is isolated from transmit circuitry and/or receive circuitry of a PHY.

In response to the snooping of Powerdn, TxElecIdle and TxdetectRx/Loopback a link controller may generate a corresponding combination of other control signals—e.g., including the signals HostDetectReq, HostLfpsReq, RxStatus and RxValid shown. HostDetectReq may be an intermediate signal generated by the link controller to start detecting for a device. HostLfpsReq is another intermediate signal generated by the link controller to facilitate Low Frequency Periodic Signaling (LFPS)—e.g., a sideband communication—between the host and either a device control interface or a debug controller. RxStatus encodes a receiver status and error codes for transmission to the device control interface (or debug controller). RxValid assigns appropriate symbol lock and valid data signals for signals that are to be communicated along a loopback path.

The generation of HostDetectReq, HostLfpsReq, RxStatus and RxValid based at least in part on Powerdn, TxElecIdle and TxdetectRx/Loopback may facilitate any of a variety of states with the link controller. By way of illustration and not limitation, state 410 may configure the link controller to communicate data via the USB PHY. By contrast, state 415 may preserve an electric idle state of the link controller. State 420 may put the link controller in a loopback mode, whereas state 425 may include an idle state of the link controller. In one embodiment, state 430 is for the link controller to transmit data in a functional mode—e.g., via a USB PHY coupled thereto. State 435 may include an electric idle state which, for example, prohibits transmitting with the link controller. State 440 is an illegal state, in some embodiments. During state 445, the link controller and the USB PHY may be idle. Alternatively or in addition, state 450 may configure the link controller to detects for a receiver device. During state 455, the link controller may transmit a beacon signal—e.g., whereas the link controller may be idle in state 460.

Figure 5:
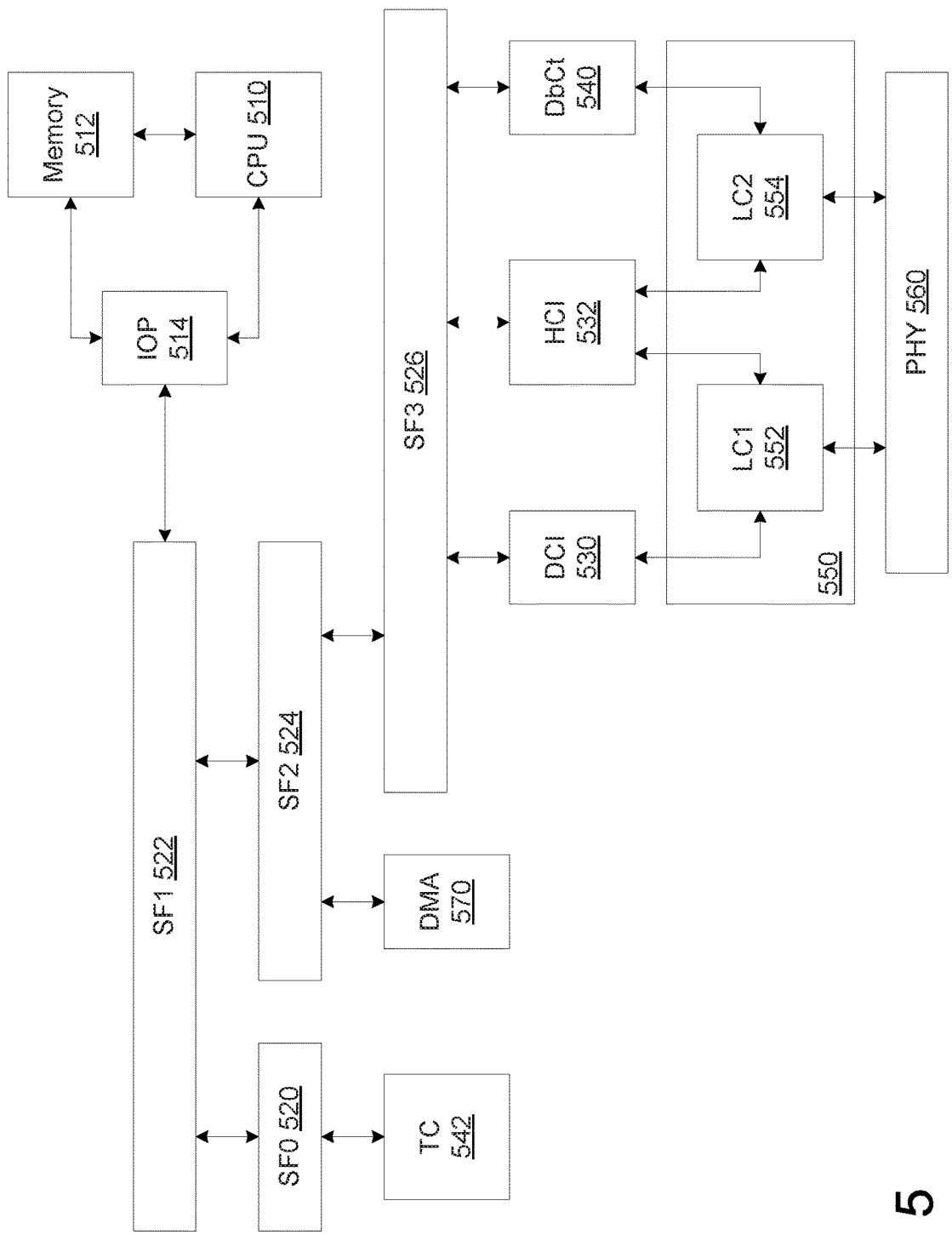
FIG. 5 is a functional block diagram illustrating elements of a system to test or debug integrated circuitry according to an embodiment.

FIG. 5 illustrates elements an IC chip 500 to provide link control functionality according to an embodiment. IC chip 500 may include some or all of the features of IC chip 100, for example. In an embodiment, method 200 is performed with circuitry such as that of IC chip 500. In the illustrative embodiment shown, IC chip 500 includes a central processing unit (CPU) 510, link control layer 550, PHY 560, test controller TC 542, device control interface DCI 530, host control interface HCI 532 and debug controller DbCt 540—e.g., which, respectively, correspond functionally to host 110, link control layer 150, PHY 160, TC 142, DCI 130, HCI 132 and DbCt 140.

IC chip 500 may include one or more devices to be variously controlled directly or indirectly by one or more host processes executed with CPU 510. By way of illustration and not limitation, such one of more devices may include a memory 512, input/output processor IOP 514, and direct memory access circuitry DMA 570. However, IC chip 500 may include more, fewer and or different devices to be controlled by CPU 510, in different embodiments.

An interconnect architecture (e.g., corresponding functionally to interconnect 120) may variously couple CPU 510 and devices of IC chip 500 to PHY 560. Such an interconnect architecture may include, for example, one or more scalable fabrics such as the illustrative scalable fabrics SF0 520, SF1 522, SF2 524 and SF3 526 shown. The particular number and configuration of such one or more scalable fabrics may vary in different embodiments.

Link control layer 550 may include multiple link controllers each coupled between PHY 560 and one of the scalable fabrics (e.g., SF3 526). For example, to facilitate emulation functionality according to an embodiment, a link controller LC1 552 of link control layer 550 may be coupled to PHY 560 and further coupled to each of DCI 530 and HCI 532. Another link controller LC2 554 of link control layer 550 may be additionally or alternatively coupled to PHY 560 and further coupled to each of DCI 530 and DbCt 540. One or both of LC1 552 and LC2 554 may have respective features of link controller 300, for example.

Figure 6A:
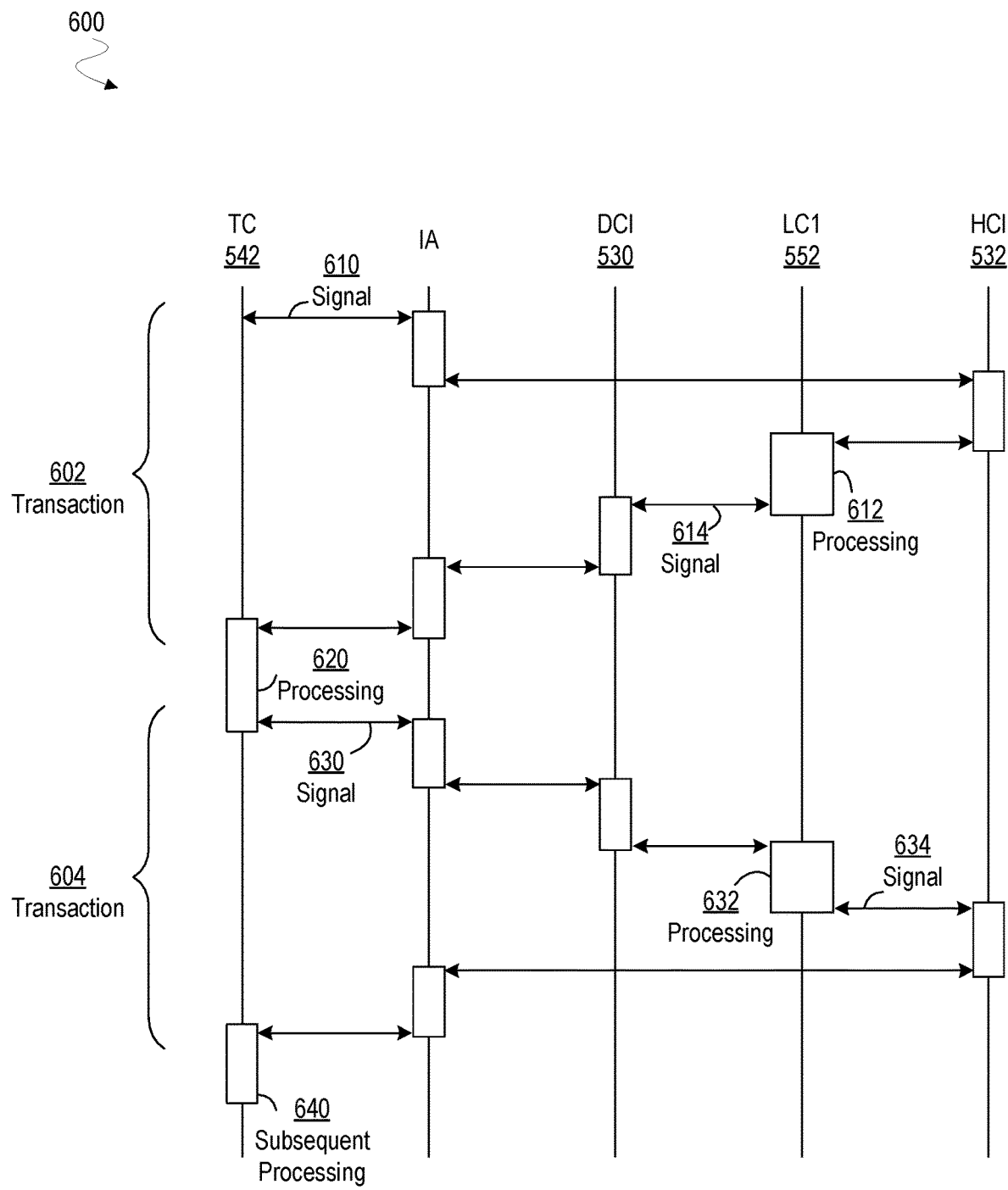
FIGS. 6A, 6B are swim-lane diagram illustrating elements of respective communication sequences each to provide test or debug functionality according to a corresponding embodiment.
Figure 6B:
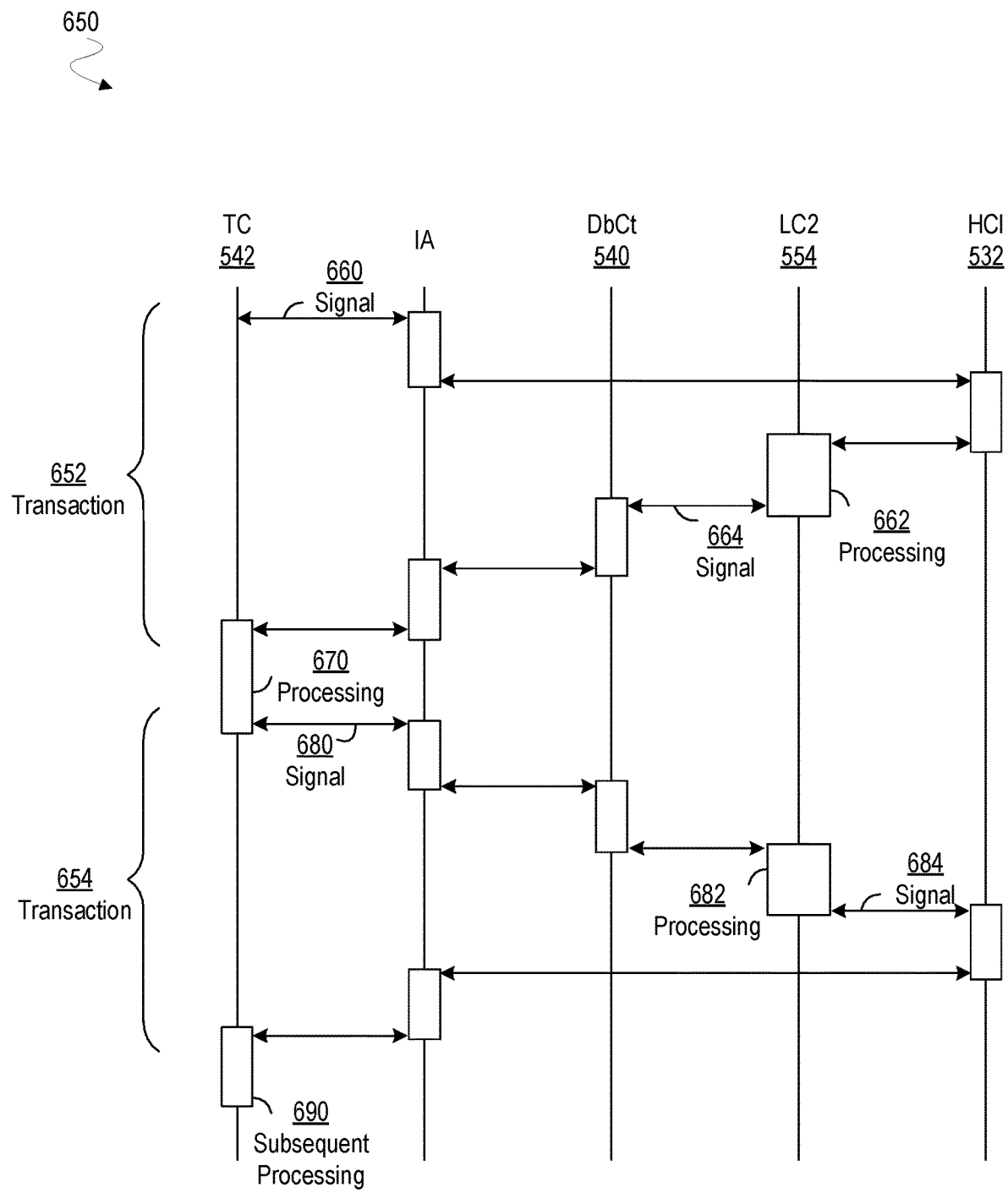

FIGS. 6A, 6B show respective exchanges 600, 650 to variously provide test and/or debug functionality each according to a corresponding embodiment. One or both of exchanges 600, 650 may include operations of method 200, for example. To illustrate certain features of various embodiments, exchange 600 is shown as taking place with resources of IC chip 500. However, other exchanges may be similarly performed at IC chip 100 and/or any of a variety of other devices according to different embodiments.

In the illustrative embodiment shown in FIG. 6A, exchange 600 includes a transaction 602 wherein TC 542 sends signals 610 to LC1 552 via the interconnect architecture IA (comprising SF0 520, SF1 522, SF2 524 and SF3 526) and via HCI 532. LC1 552 may perform processing 612 based on signals 610 to generate other signals 614—e.g., wherein a test mode of LC1 552 results in signals 614 being generated and looped back to the interconnect architecture IA via DCI 530. The signals 614 may emulate—e.g., to DCI 530, to the interconnect architecture IA and/or the like—a communication received from a host process of CPU 510. Alternatively, signals 614 may emulate an output by a receiver unit of PHY 560.

In some embodiments, exchange 600 further comprises another transaction 604 wherein TC 542 sends signals 630 to LC1 552 via the interconnect architecture IA and via DCI 530. The signals 630 may be generated, for example, based on processing 620 of signals 614 (e.g., in response to receipt and, in some embodiments, test processing thereof). LC1 552 may perform processing 632 based on signals 630 to generate other signals 634—e.g., wherein a test mode of LC1 552 results in signals 634 being generated and looped back to the interconnect architecture IA via HCI 532. The signals 634 may emulate to HCI 532 (or other circuitry of IC chip 500) a communication received from a device of IC chip 500 (such as DMA 570). Alternatively, signals 634 may emulate an output by a receiver unit of PHY 560. Subsequent processing 640 of signals 634 by TC 542 may include evaluation processing to determine—e.g., based on signature information—whether one or more resources of IC chip 500 which participated in transaction 602 and/or transaction 604 fail to meet one or more performance criteria.

In the illustrative embodiment shown in FIG. 6B, exchange 650 includes a transaction 652 wherein TC 542 sends signals 660 to LC1 552 via the interconnect architecture IA and via HCI 532. LC1 552 may perform processing 662 based on signals 660 to generate other signals 664— e.g., wherein a test mode of LC1 552 results in signals 664 being generated and looped back to the interconnect architecture IA via DCI 530. The signals 664 may emulate—e.g., to DCI 530, to the interconnect architecture IA and/or the like—a communication received from a host process of CPU 510. Alternatively, signals 664 may emulate an output by a receiver unit of PHY 560.

In some embodiments, exchange 650 further comprises another transaction 654 wherein TC 542 sends signals 680 to LC1 552 via the interconnect architecture IA and via DCI 530. The signals 680 may be generated, for example, based on processing 670 of signals 664 (e.g., in response to receipt and, in some embodiments, test processing thereof). LC1 552 may perform processing 682 based on signals 680 to generate other signals 684—e.g., wherein a test mode of LC1 552 results in signals 684 being generated and looped back to the interconnect architecture IA via HCI 532. The signals 684 may emulate to HCI 532 (or other circuitry of IC chip 500) a communication received from a device of IC chip 500 (such as DMA 570). Alternatively, signals 684 may emulate an output by a receiver unit of PHY 560. Subsequent processing 690 of signals 684 by TC 542 may include evaluation processing to determine whether DbCt 540 (and/or one or more resources of IC chip 500 which participated in transaction 602 or transaction 604) fail to meet one or more performance criteria.

Figure 7:
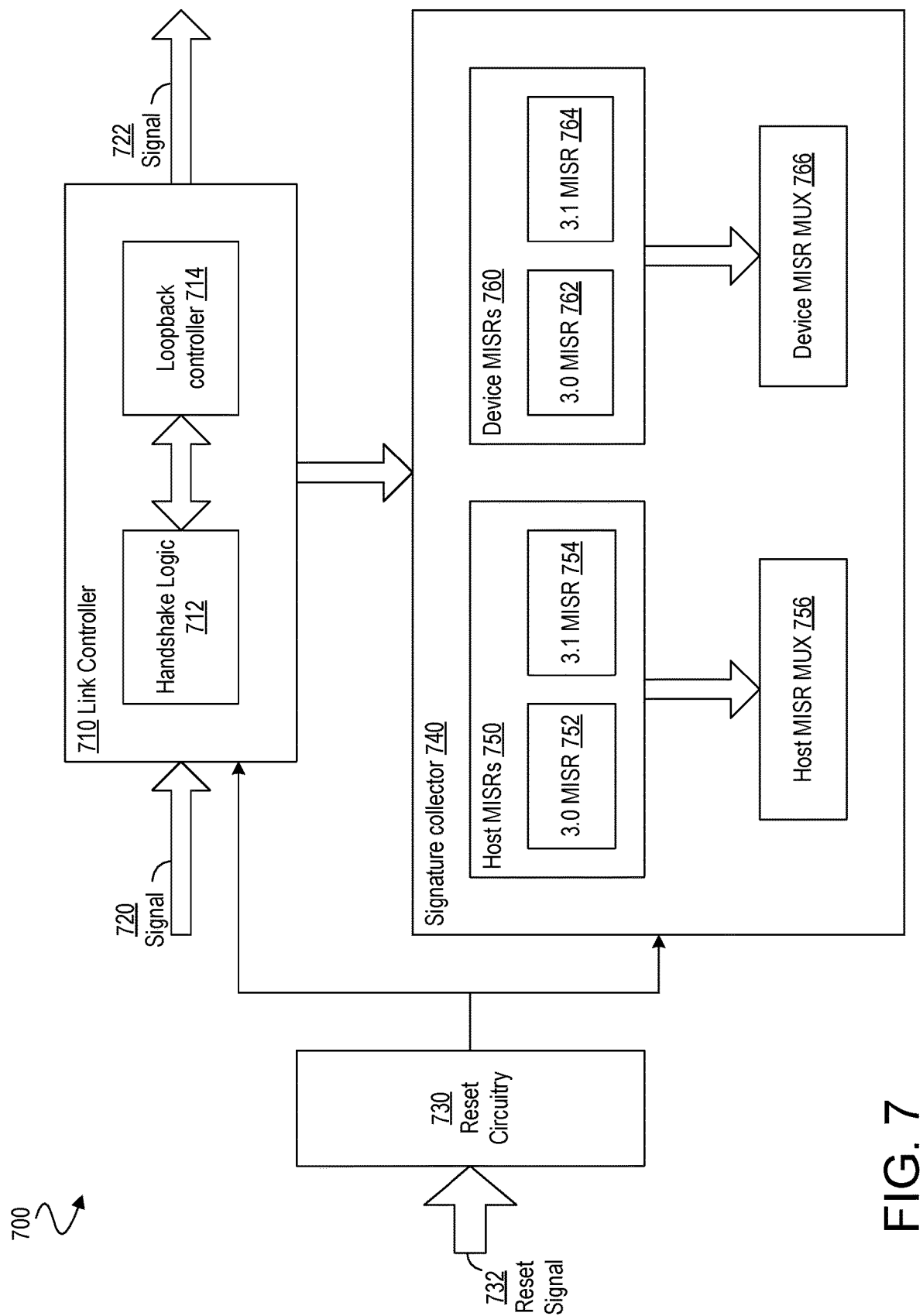
FIG. 7 is a functional block diagram illustrating elements of a link controller according to an embodiment.

FIG. 7 illustrates elements a IC chip 700 to perform test and/or debug processes according to an embodiment. IC chip 700 is one example of an embodiment that is configured to collect and evaluate signature information—e.g., to determine whether one or more components of IC chip 700 have failed to meet one or more test criteria. IC chip 700 may include some or all of one of IC chips 100, 500, for example. In an embodiment, test/debug processing performed with IC chip 700 may be part of, or based on, method 200.

In the illustrative embodiment shown, IC chip 700 includes a link controller 710—e.g., having features of one of link controllers 152, 300—which comprises handshake logic 712 and loopback controller 714. Handshake logic 712 may communicate with a test controller of IC chip 700 (such one of TC 142 and TC 542)—e.g., where such communications are to determine a mode of link controller 710, to initialize the accumulation of signature information, etc.

For example, the test controller may couple to or include reset circuitry 730 which, responsive to a reset signal 732, initializes link controller 710 and a signature collector 740 coupled thereto—e.g., by flushing old signature information from signature collector 740. In another embodiment, signature collector 740 is a component of link controller 710. After such initialization, link controller may receive signals 720 (e.g., including one of signals 610, 630) that, for example, are provided by a host control interface, a device control interface or a debug controller.

In an illustrative scenario according to one embodiment, the test controller signals a loopback controller 714 of link controller 710 to implement a test mode which generates signals 722 (e.g., including one of signals 614, 634) based on signals 720. Based on the test mode, loopback controller 714 may send the generated signals 722 back to an interconnect architecture (not shown) from which signals 720 were received. Prior to or during communication of signals 722 from link controller 710, some or all of signals 720, 722 may be variously copied or otherwise used to generate signature information which indicates an integrity of one or more IC chip resources which participated in the communication of signals 720 to link controller 710. By way of illustration and not limitation, signature collector 740 may include multiple input shift register (MISR) circuitry to variously store such signature information. For example, host MISRs 750 and device MISRs 760 may variously store signature information indicating, respectively, operational health of a host of IC chip 700 and operational health of another resource (device) of IC chip 700.

Host MISRs 750 and/or device MISRs 760 may accommodate integration in any of a variety of IC chips supporting different communication standards. For example, host MISRs 750 may include a 3.0 MISR 752 to store signature information used in testing USB 3.0 functionality, as well as a 3.1 MISR 754 to store signature information used in testing USB 3.1 functionality. Alternatively or in addition, device MISRs 760 may similarly include both a 3.0 MISR 762 to store signature information used in testing USB 3.0 functionality, and a 3.1 MISR 764 to store signature information used in testing USB 3.1 functionality. Selection between 3.0 MISR 752 and 3.1 MISR 754 may be performed with a host MISR multiplexer (MUX) 756—e.g., wherein selection between 3.0 MISR 762 and 3.1 MISR 764 is similarly performed with a device MISR MUX 766. In an embodiment, signature information output by host MISR MUX 756 or by device MISR MUX 766 may be compared or otherwise evaluated based on reference signature information that, for example, is preprogrammed or otherwise provided by a manufacturer, vendor, system administrator or other authorized agent. Such reference signature information may function as a predetermined a priori criteria associated with known-good performance of host, device, debug and/or other circuitry.

Figure 8:
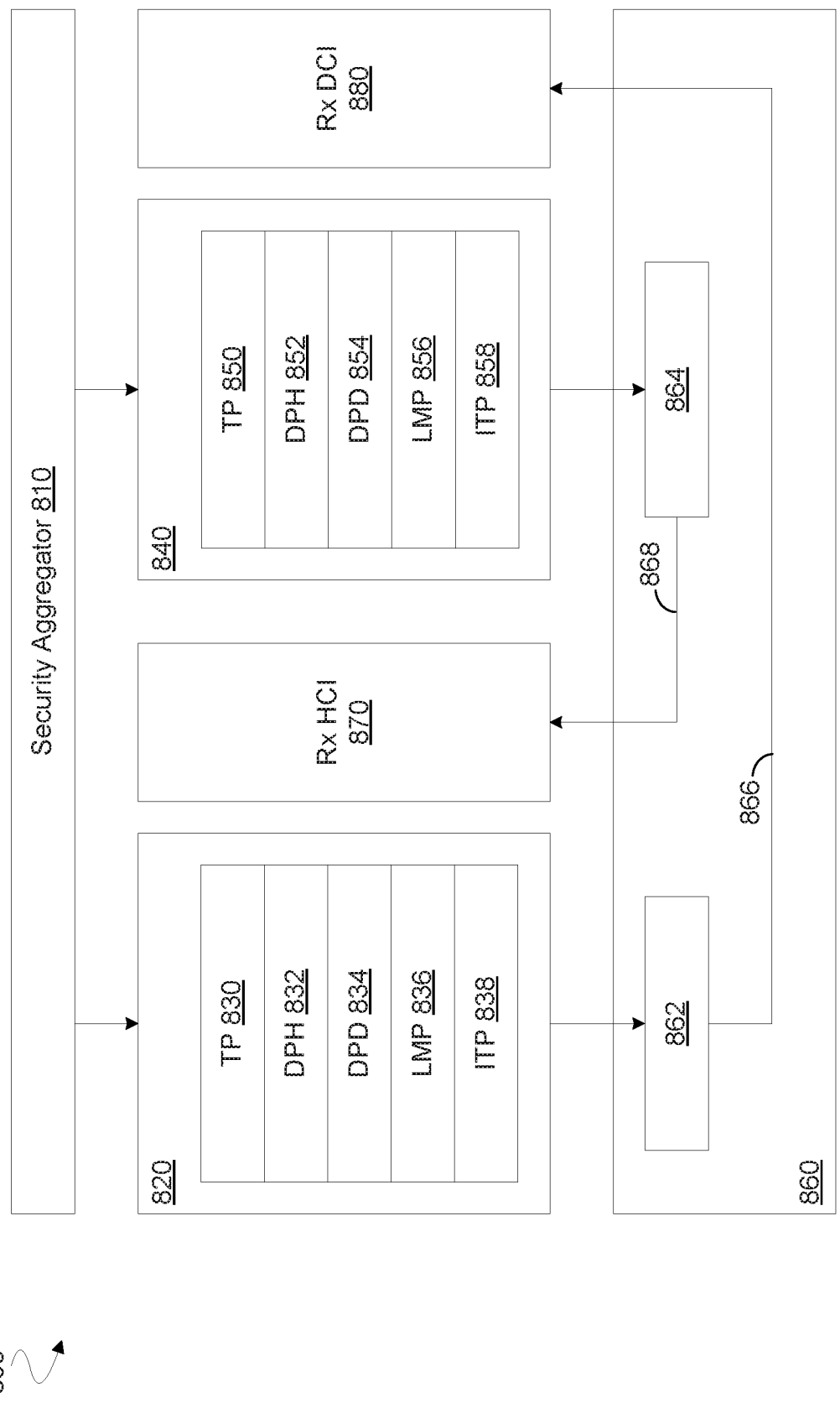
FIG. 8 is a functional block diagram illustrating elements of a test/debug architecture according to an embodiment.

FIG. 8 illustrates elements an IC chip 800 to provide test functionality according to an embodiment. IC chip 800 may include some or all of one of IC chips 100, 500, 700, for example. In an embodiment, test/debug processing performed with IC chip 800 may be part of, or based on, method 200. In the illustrative embodiment shown, IC chip 800 includes a security aggregator 810 that, for example, provides functionality of signature collector 740. Security aggregator 810 may be coupled to circuitry which is to communicate different types of data packet information. In such an embodiment, security aggregator 810 may collect various types of signature information each corresponding to a different respective type of data packet information. By way of illustration and not limitation, security aggregator 810 may be variously coupled to host control interface transmit logic 820 and host control interface receive logic Rx HCI 870 (e.g., both of HCI 132), to a link controller 860 and further to device/debug control interface transmit logic 840 and device/debug control interface receive logic Rx DCI 880 (e.g., both of DCI 130 or both of DbCt 140).

During test mode operation, a loopback path 862 of link controller 862 may communicate to Rx DCI 880 signals 866 which are based on an input from host control interface transmit logic 820. Such an input may include some or all of transaction packet (TP) information 830 to control the flow of data packets, data packet header (DPH) information 832 which encapsulates payload data, and data packet data (DPD) information 834 comprising the payload data. Alternatively or in addition, the input from host control interface transmit logic 820 may include link management packet (LMP) information 836 to implement link management mechanisms and/or isochronous time stamp packet (ITP) information 838 which is broadcast on currently-active links.

Test mode operation may further include a loopback path 864 communicating to Rx HCI 870 signals 868 which are based on an input from device/debug control interface transmit logic 840. Similar to the host control interface transmit logic 820, device control interface transmit logic 840 may input some or all of TP information 850, DPH information 852, DPD information 854, LMP information 856 and ITP information 858.

Security aggregator may be coupled to variously accumulate TP signature information based on some or all of TP information 830, 850, to accumulate DHP signature information based on some or all of DHP information 832, 852 and/or other such signature information which is specific to different classes of packet information. Some or all such signature information may be variously compared or otherwise evaluated based on predetermined "known-good" signatures to test whether and/or how resources of IC chip 800 might fail one or more tests. The provisioning of known-good signatures, and the evaluation of IC resources based on such known-good signature, may include operations adapted from conventional test evaluation processing, which are not detailed herein to avoid obscuring features of various embodiments.

Figure 9:
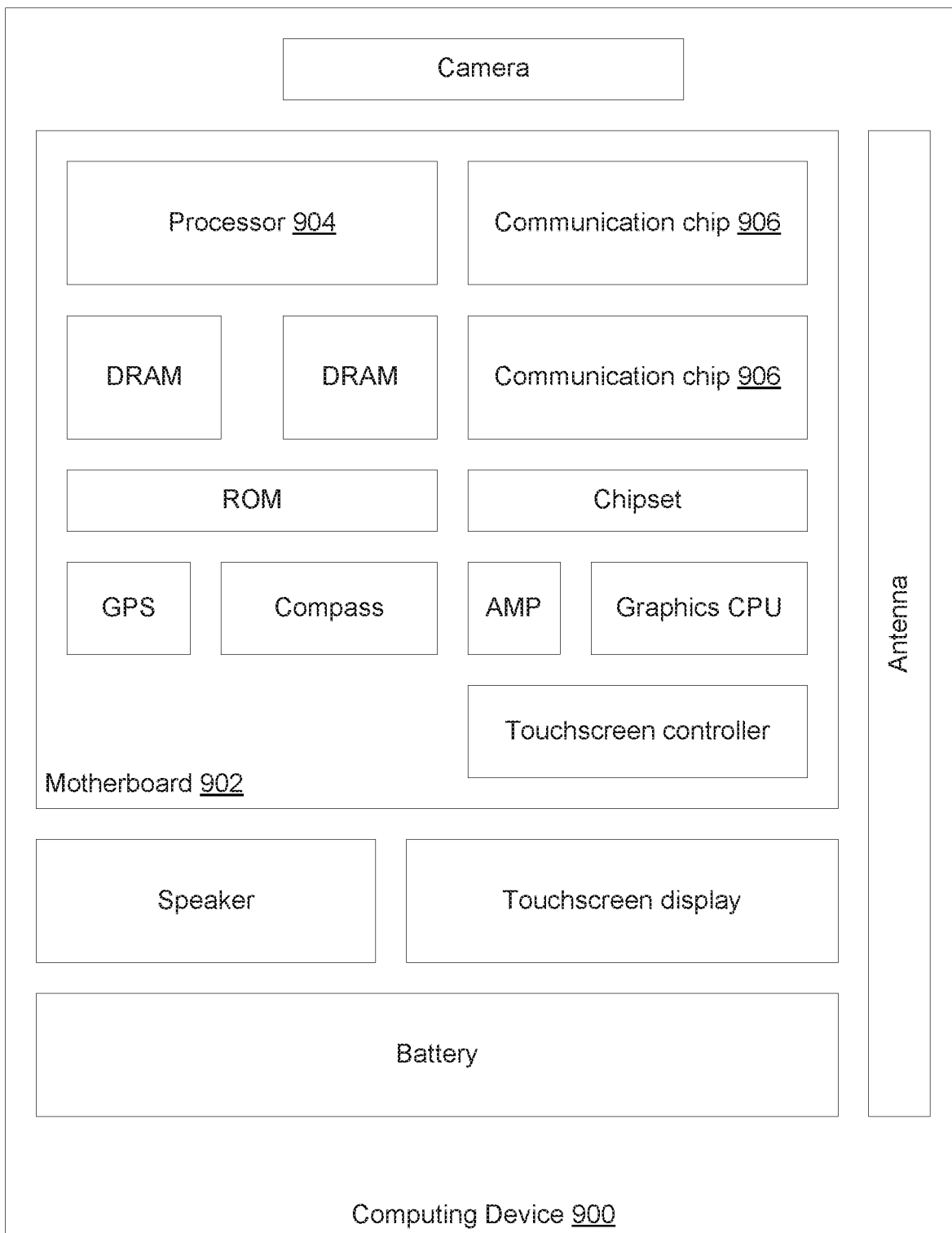
FIG. 9 is a functional block diagram illustrating elements of a computing device according to an embodiment.

FIG. 9 illustrates a computing device 900 in accordance with one embodiment. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. The term "processor" may refer to any device or portion of a device that processes electronic data from registers and/or memory to transform that electronic data into other electronic data that may be stored in registers and/or memory. The communication chip 906 also includes an integrated circuit die packaged within the communication chip 906.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 10:
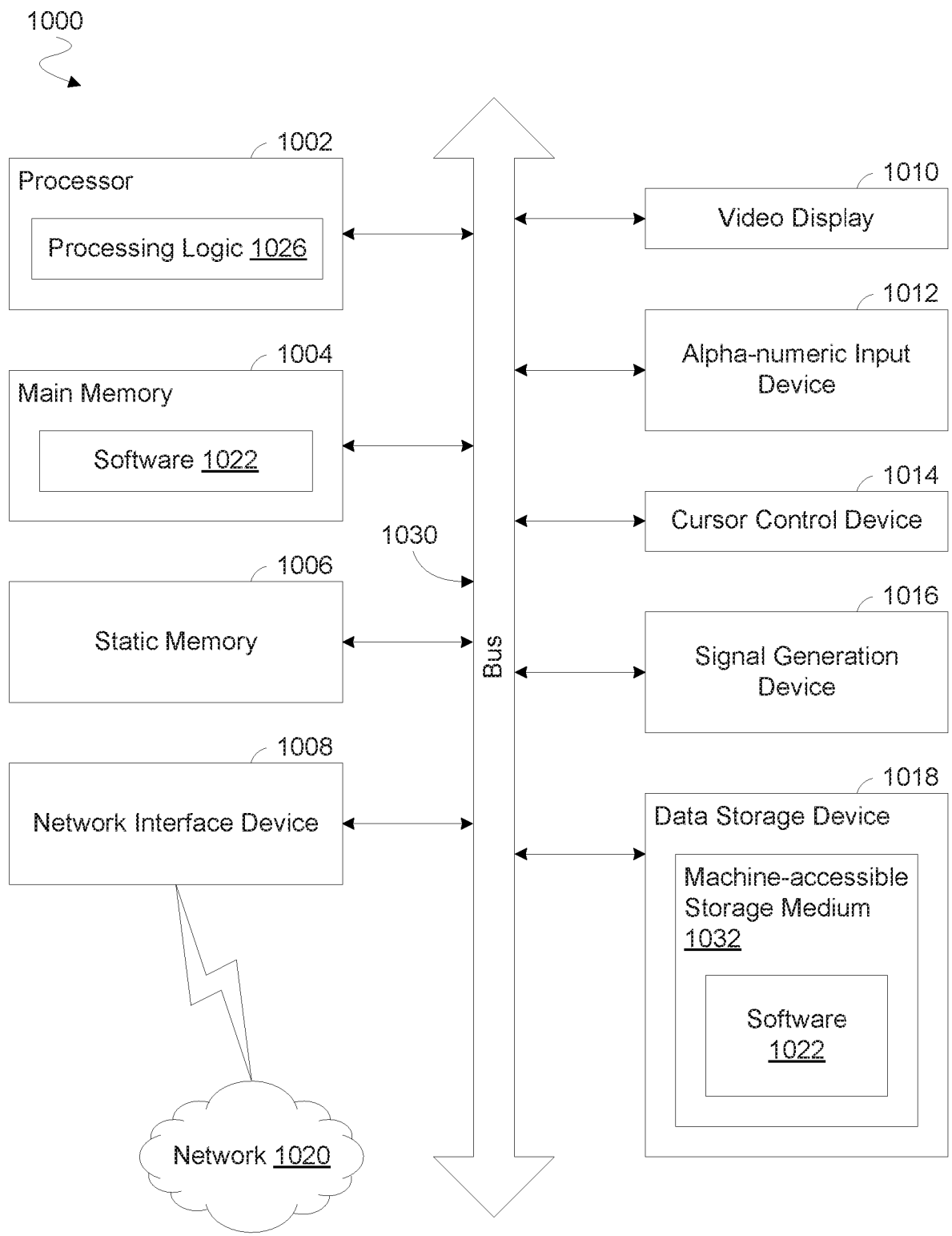
FIG. 10 is a functional block diagram illustrating elements of a computer system according to an embodiment.

FIG. 10 illustrates a diagrammatic representation of a machine in the exemplary form of a computer system 1000 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations described herein.

The computer system 1000 may further include a network interface device 1008. The computer system 1000 also may include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1032 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1032 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, an integrated circuit (IC) chip comprises a physical (PHY) layer to perform communications compatible with a universal serial bus standard that supports a data rate of a data rate of 1.5 Megabits per second (Mbps) or more, an interconnect, a link control layer coupled between the interconnect and the PHY layer, the link control layer including a first link controller coupled to the interconnect via a host control interface, and further coupled to the interconnect via one of a device control interface and a debug controller. The IC chip further comprises a test controller to configure a test mode of the first link controller and to send first signals to the first link controller via the interconnect and the host control interface, wherein based on the test mode, the first link controller to disable one or more paths of communication between the link control layer and the PHY layer, and emulate a communication received from a resource other than the test controller, including the first link controller to provide second signals, based on the first signals, to one of a device control interface and a debug controller coupled between the link control layer and the interconnect.

In an embodiment, the IC chip further comprises the debug controller, wherein the link control layer further includes a second link controller coupled to the interconnect via the host control interface, and further coupled to the interconnect via the debug controller, and wherein the first link controller is coupled to the interconnect via the device control interface. In another embodiment, the universal serial bus standard is defined by one of a Universal Serial Bus (USB) 3.0 specification, a USB 3.1 specification, a Serial ATA (SATA) revision 3.2 specification and a Peripheral Component Interconnect Express (PCIe) base 3.1 specification. In another embodiment, the second signals emulate to the device control interface a communication provided by a host process executed at the IC chip.

In another embodiment, the test controller is further to send third signals to the first link controller via the interconnect and the one of the device control interface and the debug controller, wherein based on the test mode, the first link controller to emulate a communication received from another resource other than the test controller, including the first link controller to provide fourth signals, based on the third signals, to the host control interface. In another embodiment, the test controller is to send the third signals to the first link controller via the interconnect and the debug controller, the test controller further to perform an evaluation of the debug controller based on the second signals and the fourth signals. In another embodiment, the first link controller is further to receive a memory access request from the interconnect via one of the host control interface and the device control interface, wherein the memory access request targets a first memory resource, the first link controller to convert the memory access request to emulate a request which targets a memory resource other than the first memory resource.

In another implementation, a method at an integrated circuit (IC) chip comprises, with a physical (PHY) layer of the IC chip, performing communications compatible with a universal serial bus standard that supports a data rate of 1.5 Megabits per second (Mbps) or more, wherein a link control layer of the IC chip is coupled between an interconnect and the PHY layer, the link control layer including a first link controller coupled to the interconnect via a host control interface, and further coupled to the interconnect via one of a device control interface and a debug controller coupled between the link control layer and the interconnect. The method further comprises configuring a test mode of the first link controller, including disabling one or more paths of communication between the link control layer and the PHY layer, receiving at the first link controller first signals sent, via the interconnect and the host control interface, from a test controller of the IC chip, and in response to the configuring and based on the receiving, emulating a communication received from a resource other than the test controller, including the first link controller generating second signals based on the first signals and providing the second signals to the one of the device control interface and the debug controller.

In an embodiment, the universal serial bus standard is defined by one of a Universal Serial Bus (USB) 3.0 specification, a USB 3.1 specification, a Serial ATA (SATA) revision 3.2 specification and a Peripheral Component Interconnect Express (PCIe) base 3.1 specification. In another embodiment, the second signals emulate to the device control interface a communication provided by a host process executed at the IC chip. In another embodiment, the method further comprises sending third signals from the test controller to the first link controller via the interconnect and the one of the device control interface and the debug controller, and based on the test mode, emulating with the first link controller a communication received from another resource other than the test controller, including the first link controller providing fourth signals, based on the third signals, to the host control interface. In another embodiment, the test controller further sends third signals to the first link controller via the interconnect and the debug controller, and the test controller further performs an evaluation of the debug controller based on the second signals and the fourth signals. In another embodiment, the method further comprises receiving at the first link controller a memory access request from the interconnect via one of the host control interface and the device control interface, wherein the memory access request targets a first memory resource, and with the first link controller, converting the memory access request to emulate a request which targets a memory resource other than the first memory resource.

In another implementation, a system comprises an integrated circuit (IC) chip including a physical (PHY) layer to perform communications compatible with a universal serial bus standard that supports a data rate of a data rate of 1.5 Megabits per second (Mbps) or more, an interconnect, and a link control layer coupled between the interconnect and the PHY layer, the link control layer including a first link controller coupled to the interconnect via a host control interface, and further coupled to the interconnect via one of a device control interface and a debug controller. The IC chip further comprises a test controller to configure a test mode of the first link controller and to send first signals to the first link controller via the interconnect and the host control interface, wherein based on the test mode, the first link controller to disable one or more paths of communication between the link control layer and the PHY layer, and emulate a communication received from a resource other than the test controller, including the first link controller to provide second signals, based on the first signals, to one of a device control interface and a debug controller coupled between the link control layer and the interconnect. The system further comprises a display device coupled to the IC chip, the display device to display an image based on signals exchanged with the IC chip.

In an embodiment, the IC chip further comprises the debug controller, wherein the link control layer further includes a second link controller coupled to the interconnect via the host control interface, and further coupled to the interconnect via the debug controller, and wherein the first link controller is coupled to the interconnect via the device control interface. In another embodiment, the universal serial bus standard is defined by one of a Universal Serial Bus (USB) 3.0 specification, a USB 3.1 specification, a Serial ATA (SATA) revision 3.2 specification and a Peripheral Component Interconnect Express (PCIe) base 3.1 specification.

In another embodiment, the second signals emulate to the device control interface a communication provided by a host process executed at the IC chip. In another embodiment, the test controller is further to send third signals to the first link controller via the interconnect and the one of the device control interface and the debug controller, wherein based on the test mode, the first link controller to emulate a communication received from another resource other than the test controller, including the first link controller to provide fourth signals, based on the third signals, to the host control interface. In another embodiment, the test controller is to send the third signals to the first link controller via the interconnect and the debug controller, the test controller further to perform an evaluation of the debug controller based on the second signals and the fourth signals. In another embodiment, the first link controller is further to receive a memory access request from the interconnect via one of the host control interface and the device control interface, wherein the memory access request targets a first memory resource, the first link controller to convert the memory access request to emulate a request which targets a memory resource other than the first memory resource.

Techniques and architectures for providing test/debug functionality with an integrated circuit chip are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) chip comprising:
   a physical (PHY) layer to perform communications compatible with a universal serial bus standard that supports a data rate of 1.5 Megabits per second (Mbps) or more;
   an interconnect;
   a link control layer coupled between the interconnect and the PHY layer, the link control layer including a first link controller coupled to the interconnect via a host control interface, and further coupled to the interconnect via one of a device control interface and a debug controller;
   a test controller to configure a test mode of the first link controller and to send first signals to the first link controller via the interconnect and the host control interface, wherein based on the test mode, the first link controller to:
   disable one or more paths of communication between the link control layer and the PHY layer; and
   emulate a communication received from a resource other than the test controller, wherein the first link controller is configured to provide second signals, based on the first signals, to one of a device control interface and a debug controller coupled between the link control layer and the interconnect.

2. The IC chip of claim 1, further comprising the debug controller, wherein the link control layer further includes a second link controller coupled to the interconnect via the host control interface, and further coupled to the interconnect via the debug controller, and wherein the first link controller is coupled to the interconnect via the device control interface.

3. The IC chip of claim 1, wherein the universal serial bus standard is defined by one of a Universal Serial Bus (USB) 3.0 specification, a USB 3.1 specification, a Serial ATA (SATA) revision 3.2 specification and a Peripheral Component Interconnect Express (PCIe) base 3.1 specification.

4. The IC chip of claim 1, wherein the second signals emulate to the device control interface a communication provided by a host process executed at the IC chip.

5. The IC chip of claim 1, the test controller further to send third signals to the first link controller via the interconnect and the one of the device control interface and the debug controller, wherein based on the test mode, the first link controller to emulate a communication received from another resource other than the test controller, including the first link controller to provide fourth signals, based on the third signals, to the host control interface.

6. The IC chip of claim 5, wherein the test controller to send the third signals to the first link controller via the interconnect and the debug controller, the test controller further to perform an evaluation of the debug controller based on the second signals and the fourth signals.

7. The IC chip of claim 1, the first link controller further to receive a memory access request from the interconnect via one of the host control interface and the device control interface, wherein the memory access request targets a first memory resource, the first link controller to convert the memory access request to emulate a request which targets a memory resource other than the first memory resource.

8. A method at an integrated circuit (IC) chip, the method comprising:
with a physical (PHY) layer of the IC chip, performing communications compatible with a universal serial bus standard that supports a data rate of 1.5 Megabits per second (Mbps) or more, wherein a link control layer of the IC chip is coupled between an interconnect and the PHY layer, the link control layer including a first link controller coupled to the interconnect via a host control interface, and further coupled to the interconnect via one of a device control interface and a debug controller coupled between the link control layer and the interconnect;
configuring a test mode of the first link controller, including disabling one or more paths of communication between the link control layer and the PHY layer;
receiving at the first link controller first signals sent, via the interconnect and the host control interface, from a test controller of the IC chip; and
in response to the configuring and based on the receiving, emulating a communication received from a resource other than the test controller, including generating, by the first link controller, second signals based on the first signals and providing the second signals to the one of the device control interface and the debug controller.

9. The method of claim 8, wherein the universal serial bus standard is defined by one of a Universal Serial Bus (USB) 3.0 specification, a USB 3.1 specification, a Serial ATA (SATA) revision 3.2 specification and a Peripheral Component Interconnect Express (PCIe) base 3.1 specification.

10. The method of claim 8, wherein the second signals emulate to the device control interface a communication provided by a host process executed at the IC chip.

11. The method of claim 8, further comprising:
sending third signals from the test controller to the first link controller via the interconnect and the one of the device control interface and the debug controller; and
based on the test mode, emulating with the first link controller a communication received from another resource other than the test controller, including the first link controller providing fourth signals, based on the third signals, to the host control interface.

12. The method of claim 11, wherein the test controller further send third signals to the first link controller via the interconnect and the debug controller, the test controller further performs an evaluation of the debug controller based on the second signals and the fourth signals.

13. The method of claim 8, further comprising:
receiving at the first link controller a memory access request from the interconnect via one of the host control interface and the device control interface, wherein the memory access request targets a first memory resource; and with the first link controller, converting the memory access request to emulate a request which targets a memory resource other than the first memory resource.

14. A system comprising:
an integrated circuit (IC) chip including:
a physical (PHY) layer to perform communications compatible with a universal serial bus standard that supports a data rate of 1.5 Megabits per second (Mbps) or more;
an interconnect;
a link control layer coupled between the interconnect and the PHY layer, the link control layer including a first link controller coupled to the interconnect via a host control interface, and further coupled to the interconnect via one of a device control interface and a debug controller; and
a test controller to configure a test mode of the first link controller and to send first signals to the first link controller via the interconnect and the host control interface, wherein based on the test mode, the first link controller to:
disable one or more paths of communication between the link control layer and the PHY layer; and
emulate a communication received from a resource other than the test controller, wherein the first link controller is configured to provide second signals, based on the first signals, to one of a device control interface and a debug controller coupled between the link control layer and the interconnect; and
a display device coupled to the IC chip, the display device to display an image based on signals exchanged with the IC chip.

15. The system of claim 14, the IC chip further comprising the debug controller, wherein the link control layer further includes a second link controller coupled to the interconnect via the host control interface, and further coupled to the interconnect via the debug controller, and wherein the first link controller is coupled to the interconnect via the device control interface.

16. The system of claim 14, wherein the universal serial bus standard is defined by one of a Universal Serial Bus (USB) 3.0 specification, a USB 3.1 specification, a Serial ATA (SATA) revision 3.2 specification and a Peripheral Component Interconnect Express (PCIe) base 3.1 specification.

17. The system of claim 14, wherein the second signals emulate to the device control interface a communication provided by a host process executed at the IC chip.

18. The system of claim 14, the test controller further to send third signals to the first link controller via the interconnect and the one of the device control interface and the debug controller, wherein based on the test mode, the first link controller to emulate a communication received from another resource other than the test controller, including the first link controller to provide fourth signals, based on the third signals, to the host control interface.

19. The system of claim 18, wherein the test controller to send the third signals to the first link controller via the interconnect and the debug controller, the test controller further to perform an evaluation of the debug controller based on the second signals and the fourth signals.

20. The system of claim 14, the first link controller further to receive a memory access request from the interconnect via one of the host control interface and the device control interface, wherein the memory access request targets a first memory resource, the first link controller to convert the memory access request to emulate a request which targets a memory resource other than the first memory resource.

\* \* \* \* \*